United States Patent [19]

Brandt et al.

[11] 3,999,213
[45] Dec. 21, 1976

[54] SEMICONDUCTOR DEVICE AND METHOD OF MANUFACTURING THE DEVICE

[75] Inventors: Bernardus Maria Michael Brandt, Nijmegen, Netherlands; Joseph Shappir, Haifa, Israel

[73] Assignee: U.S. Philips Corporation, New York, N.Y.

[22] Filed: Oct. 29, 1974

[21] Appl. No.: 518,227

Related U.S. Application Data

[63] Continuation of Ser. No. 349,739, April 10, 1973, abandoned.

[30] Foreign Application Priority Data

Apr. 14, 1972 Netherlands ............... 7205000

[52] U.S. Cl. .................. 357/42; 357/43; 357/50; 357/53; 357/59
[51] Int. Cl.² ........................... H01L 27/02
[58] Field of Search .......... 357/40, 42, 43, 50, 357/53, 59

[56] References Cited
UNITED STATES PATENTS

| | | | |
|---|---|---|---|
| 3,340,598 | 9/1967 | Hatcher | 357/42 |
| 3,432,731 | 3/1969 | Whittier | 357/53 |
| 3,534,234 | 10/1970 | Clevenger | 357/50 |
| 3,596,115 | 7/1971 | Conzelmann et al. | 357/40 |
| 3,600,648 | 8/1971 | Longo | 357/53 |
| 3,646,665 | 3/1972 | Kim | 357/59 |
| 3,648,125 | 3/1972 | Peltzer | 357/50 |
| 3,755,001 | 8/1973 | Kool et al. | 357/50 |
| 3,755,014 | 8/1973 | Appels et al. | 357/50 |
| 3,909,318 | 9/1975 | Lecan et al. | 357/50 |

*Primary Examiner*—Andrew J. James
*Assistant Examiner*—Joseph E. Clawson, Jr.
*Attorney, Agent, or Firm*—Frank R. Trifari; Jack Oisher

[57] ABSTRACT

A semiconductor device particularly suitable for ICs with complementary field effect transistors and/or bipolar circuit elements comprises a semiconductor body having a first type substrate region on which is a second type epitaxial layer of which a part is bounded by an inset insulating pattern. A first type zone adjoins the inset pattern and extends down to the substrate region. Source and drain zones of an IGFET adjoin the pattern and are provided in the said epitaxial part, and a further circuit element is provided in the said first type zone.

14 Claims, 18 Drawing Figures

SEMICONDUCTOR DEVICE AND METHOD OF MANUFACTURING THE DEVICE

This is a continuation of application Ser. No. 349,739, filed Apr. 10, 1973, now abandoned.

The invention relates to a semiconductor device having a semiconductor body comprising at least one insulated gate field effect transistor, said body comprising a surface-adjoining first region of a first conductivity type and a second region of the second conductivity type adjoining said surface and forming a p-n junction with the first region, surface-adjoining source and drain zones of the first conductivity type associated with the field effect transistor being provided in the second region, at least one gate electrode layer being provided between said source and drain zones and being separated from the semiconductor body by an insulating layer, said device comprising a pattern of electrically insulating material which is at least partially inset or embedded in the semiconductor body and which substantially entirely bounds the second region at the surface, the said p-n junction adjoining the inset pattern and the said source and drain zone adjoining the inset pattern, the second region comprising a part of an epitaxial layer of the second conductivity type which is provided on a substrate region of the first conductivity type associated with the first region.

The invention furthermore relates to a particularly advantageous method of manufacturing the device.

Semiconductors devices of the described type are known and are used in various embodiments, particularly in monolithic integrated circuits. Such a structure in which the source and drain zones of the said field effect transistor are present in a region which is separated from the remaining part of the semiconductor body by a p-n junction is of particular importance in that it provides the possibility of realising combinations of semiconductor circuit elements in integrated circuits which are interesting from a circuit technical and technological point of view.

For example, in addition to the said field effect transistor, one or more field effect transistors having a structure which is complementary thereto can be provided in the same semiconductor body in a very simple manner. Such combinations of p-channel and n-channel field effect transistors are used in many important integrated circuits, particularly in memory circuits.

The described semiconductor devices are preferably used in high speed circuits and it is therefore of importance that the dimensions and hence also the various capacitances of the resulting structure be maintained as small as possible, as a result of which the packing density (number of circuit elements per unit surface area) can also be increased. In known semiconductor devices, this is often the case to an insufficient extent, which is caused to an important extent by the masking and alignment steps necessary for the manufacture and the tolerances to be observed.

One of the objects of the present invention is to provide a semiconductor device having a novel structure and comprising at least one field effect transistor having very small dimensions with which a very high packing density can be achieved. Another object of the invention is to provide a structure which is particularly suitable for the combination, in one monolithic integrated circuit, of a field effect transistor, preferably a pair of complementary insulated gate field effect transistors, with one or more bipolar circuit elements, for example bipolar (vertical or lateral) transistors.

The invention is inter alia based on the recognition of the fact that by using a pattern of insulating material which is inset at least partially in the semiconductor body in combination with a suitably chosen structure of the semiconductor body, a device can be obtained comprising preferably one or more pairs of complementary insulated gate field effect transistors with very small contact surfaces and capacitances, which device also permits a great freedom of combination with bipolar circuit elements. The invention is also based on the recognition of the fact that such a device can be manufactured by a very efficient combination of process steps in an elegant manner and with a minimum of alignment steps, several of which have very wide tolerances, if desired with the simultaneous formation of the required bipolar circuit elements.

Therefore, a semiconductor device of the type described in the preamble is characterized according to the invention in that at least a zone of the first conductivity type belonging to the first region and provided locally by the introduction of activators is present and extends from a part of the surface present outside the inset pattern throughout the thickness of the epitaxial layer and is bounded at the surface by the inset pattern, a further semiconductor circuit element being present in at least a said locally provided zone of the first conductivity type, the second region being surrounded substantially entirely by a said locally provided zone of the first conductivity type.

The structure of the device according to the invention enables inter alia the integration of complementary insulated gate field effect transistors in one semiconductor body together with, for example, bipolar (lateral and/or vertical) transistors in a very simple manner, as will be explained in greater detail hereinafter.

According to the invention, a very important preferred embodiment is characterized in that source and drain zones of the second conductivity type which adjoin the surface and the inset pattern and are associated with a second field effect transistor which is complementary to the said field effect transistor are provided in the said locally provided zone of the first conductivity type, at least one gate electrode layer being provided between said source and drain zones and being separated from the semiconductor body by an insulating layer. Such a combination of one or more field effect transistors of a given type, for example n-p-n ("n-channel" field effect transistors) with one or more field effect transistors of complementary structure (p-n-p or "p-channel" field effect transistors) is of particular importance in many circuits.

By using the process step, in which the zone of the first conductivity type extending from the surface down to the substrate region is provided also as an isolation step besides for providing in said zone an insulated gate field effect transistor, the described field effect transistor structures in a device according to the invention can advantageously be combined in various manners with bipolar circuit elements.

An important preferred embodiment is characterized in that the inset pattern at the surface also bounds a further part of the epitaxial layer, which further part is surrounded by a further said locally provided zone of the first conductivity type which extends from the surface down to the substrate region and forms therewith a p-n junction adjoining the inset pattern entirely, in which further part of the epitaxial layer at least a surface zone of the first conductivity type is provided. Such a device can advantageously be constructed so that the further part of the epitaxial layer forms the base zone of a bipolar lateral transitor of which the emitter and collctor zones are formed by surface zones of the first conductivity type provided in the further part of the epitaxial layer. As a result of this a combination with a lateral bipolar transistor is obtained, in which a buried layer of the second conductivity type and having a higher doping than the epitaxial layer is preferably provided between the further part of the epitaxial layer and the substrate region so as to prevent parasitic vertical transistor action between the collector zone and/or emitter zone and the substrate region. In order to increase its effective action, at least one of the surface zones of the first conductivity type may furthermore be formed advantageously by a zone which extends down to the buried layer.

However, the device according to the invention may also yield advantageously a combination of one or more insulated gate field effect transistors and one or more bipolar vertical transistors. For example, a very important preferred embodiment according to the invention is characterized in that a surface zone of the first conductivity type bounded entirely by the inset pattern is provided in the further part of the epitaxial layer, within which surface zone a surface zone of the second conductivity type is provided which preferably also adjoins the inset pattern, the said further part of the epitaxial layer, adjacent the surface zone of the first conductivity type, being connected to the surface via a part thereof bounded entirely by the inset pattern, the said surface zone of the first conductivity type forming the base zone of a vertical bipolar transistor the emitter zone and collector zone of which are formed by the surface zone of the second conductivity type and the further part of the epitaxial layer. In this case also, a buried layer of the second conductivity type having a higher doping than the epitaxial layer is advantageously provided between the further part of the epitaxial layer and the substrate region, in this case to reduce the collector resistance.

A further important preferred embodiment is characterized in that a surface zone of the first conductivity type is provided in the further part of the epitaxial layer, said surface zone and the first region forming the emitter and collector zones of a bipolar vertical transistor of which the further part of the epitaxial layer forms the base zone. If desired, in order to reduce the collector-series resistance, a buried layer of the first conductivity type having a higher doping than the substrate region may be provided between the further part of the epitaxial layer and the substrate region.

The vertical bipolar transistor formed may be provided in a very compact manner so that the inset pattern divides the further part of the epitaxial layer at the surface into two island-shaped parts, the pattern in the first part bounding the surface zone of the first conductivity type, the further part of the epitaxial layer adjoining the surface via the second island-shaped part.

In the above-described vertical transistors, the substrate region forms part of the collector zone or emitter zone, and these constructions can thus be used in particular when several vertical transistors have a common collector zone or emitter zone. However, the invention also presents the possibility of realising in a very simple manner combinations with fully isolated bipolar vertical transistors. In this connection, an important preferred embodiment is characterized in that a buried layer of the second conductivity type and having a higher doping than the epitaxial layer is provided between the further part of the epitaxial layer and the substrate region, that a surface-adjoining zone of the first conductivity type bounded entirely by the inset pattern is provided and adjoins the buried layer, is entirely surrounded by material of the second conductivity type and forms therewith a second p-n junction adjoining the inset pattern, a surface zone of the second conductivity type being provided in said zone, the said zone of the first conductivity type forming the base zone of a bipolar vertical transistor the emitter and collector zones of which are formed by the surface zone of the second conductivity type and the buried layer.

In this case, a vertical bipolar transistor is obtained which is entirely isolated from the remaining part of the semiconductor body by material of the second conductivity type (the buried layer and parts of the epitaxial layer). A very compact structure which can be manufactured while using alignments steps with large tolerances is obtained when the inset pattern divides the further part of the epitaxial layer at the surface into two island-shaped parts, the first part bounding the zone of the first conductivity type provided in the layer, and the second part bounding at the surface a zone of the second conductivity type which connects the buried layer to the surface.

In the structures with bipolar transistors described thus far, stray or leakage current channels may be formed by a number of causes at the surface of the semiconductor body, for example, by the formation of an inversion channel. Such stray current channels may, inter alia, cause short-circuit between the emitter-, base- and collector zone. An important preferred embodiment according to the invention is therefore characterized in that at least one field electrode is provided above the base zone of the bipolar transistor and is separated from the semiconductor surface by an insulating layer, extends down to the emitter and collector zone, and is preferably d.c. connected to the base zone, to prevent the formation of a stray current channel.

Although, of course, other conductive materials may also be used, all the gate and field electrodes advantageously consist of polycrystalline silicon which preferably is highly doped.

The described combinations of field effect transistors with bipolar circuit elements can be manufactured with a minimum number of process steps when all the said zones of the first conductivity type which extend to the substrate region or to a buried layer, mutually have substantially the same thickness, as well as all the said surface zones and source and drain zones of the first conductivity type mutually have the same thickness, and all the surface zones and the source and drain zones of the second conductivity type mutually have the same thickness.

In connection with the properties of donors and acceptors in the semiconductor material used and in particular in connection with the fact that the diffusion coefficients of acceptors in silicon which is very suitable for the formation of an inset insulating pattern generally are higher than those of donors, silicon is preferably chosen as a semiconductor material in the manufacture of the described devices, the first region being of the p-conductivity type.

As already noted before, a device according to the invention can be manufactured in a very advantageous manner, mainly by using a method which according to the invention is characterized in that a semiconductor layer of the second conductivity type is grown epitaxially on a substrate region of a semiconductor material of the first conductivity type, that a layer masking against oxidation is provided on a part of the surface of the epitaxial layer, that a layer-shaped oxide pattern which is at least partly inset in the semiconductor body and surrounds at least a surface part of the epitaxial layer substantially entirely is provided by oxidation of the surface part not covered by said masking layer, that a doping material determining the first conductivity type is provided locally in at least a part of the epitaxial layer which surrounds the said surface part entirely to form at least a zone of the first conductivity type which extends from the surface down to the substrate region, the inset pattern masking against said doping material, that a doping material determining the first conductivity type is provided locally in the said surface part to form surface zones of the first conductivity type which adjoin the inset pattern and which form the source and drain zones of a field effect transistor, the inset pattern also masking against said doping, and that at least a gate electrode layer which is separated from the semiconductor surface by an electrically insulating layer is provided between the source and drain zones.

This method is of great importance for the manufacture of a device having one or more pairs of complementary insulated gate field effect transistors. An important preferred embodiment is therefore characterized in that upon providing the zone of the first conductivity type extending from the surface down to the substrate region, the doping material is provided in a surface part of the epitaxial layer bounded by the inset pattern while using the inset pattern as a mask, that a doping material of the second conductivity type is locally provided in the thus obtained zone of the first conductivity type extending to the substrate region so as to form surface zones of the second conductivity type which form the source and drain zones of a field effect transistor which is complementary to the said field effect transistor, while using the inset pattern as a mask, and that at least one gate electrode layer which is separated from the semiconductor surface by an insulating layer is provided between said source and drain zones.

It may be of great importance, in particular to obtain the desired low threshold voltages, that, prior to providing the source and drain zones of the second conductivity type in the zone of the first conductivity type, the doping material of the first conductivity type is partially diffused out of said zone in a space having an atmosphere of reduced pressure, as a result of which the doping concentration in a surface-adjoining layer of the zone increases from the surface inwardly. The said source and drain zones of the second conductivity type are preferably provided entirely inside the said layer in which the doping concentration and particularly the surface concentration have been brought at a comparatively low value by out-diffusion.

Simultaneously with the formation of the said field effect transistors, an integration of the said field effect transistors with in particular bipolar, other circuit elements can very efficaciously be realized when, according to a preferred embodiment, the inset pattern is provided so as to also surround a further part of the epitaxial layer, that, simultaneously with the provision of the said zones of the first conductivity type extending down to the substrate region, the doping material is also provided in a part of the epitaxial layer which adjoins the inset pattern and fully surrounds said further part so as to form a further zone of the first conductivity type which entirely surrounds the further part of the epitaxial layer and extends down to the substrate region, while using the inset pattern as a mask, and that at least one surface zone of the first conductivity type is provided locally in the further part of the epitaxial layer. The surface zone of the first conductivity type preferably is bounded by the inset pattern which results in space-saving.

It is of importance for the manufacture of various interesting previously described preferred embodiments of the device according to the invention that a buried layer of the second conductivity type having a higher doping concentration than the epitaxial layer is provided at least between the further part of the epitaxial layer and the substrate region.

In some important cases it is of advantage that during the formation of the zones of the first conductivity type extending from the surface down to the substrate region at least a surface zone of the first conductivity type is provided in the further part of the epitaxial layer and extends down to a buried layer of the second conductivity type. As a result of this, as will be described in detail hereinafter, for example, bipolar structures having a comparatively large emitter or collector surface area can be obtained.

For example, a very interesting bipolar vertical transistor can be obtained when a surface zone of the second conductivity type which surrounds said surface zone entirely and preferably adjoins the inset pattern is provided within the said surface zone of the first conductivity type.

In addition to the gate electrodes of the said field effect transistors, at least one field electrode which is separated from the semiconductor surface by an insulating layer is often provided advantageously above the further part of the epitaxial layer so as to prevent or reduce stray leakage currents.

An important simplification of the required masking and alignment steps can be obtained in the described embodiments of the method according to the invention, when at least a gate- or field electrode together with the inset pattern form the mask upon providing at least one of the said surface zones.

Finally, it is to be noted that a minimum number of process steps can be obtained when in the adopted method the said surface zones of the first conductivity type are mutually provided simultaneously in the same process step and preferably the surface zones of the second conductivity type are also mutually provided simultaneously in the same process step.

The invention will now be described in greater detail with reference to a number of embodiments and the drawing, in which.

The figures are diagrammatic and not drawn to scale. Corresponding components in the figures are generally referred to by the same reference numbers. In the cross-sectional views, semiconductor zones shaded in the same direction are of the same conductivity type. In the plan view (FIG. 1) metal layers are shaded.

Figure 1:
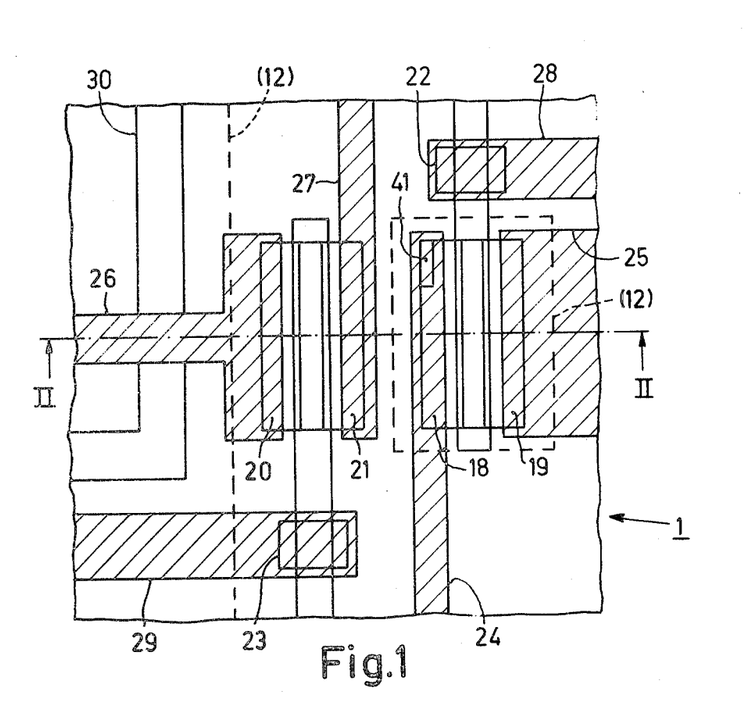
FIG. 1 is a diagrammatic plan view of a part of a device according to the invention.
Figure 2:
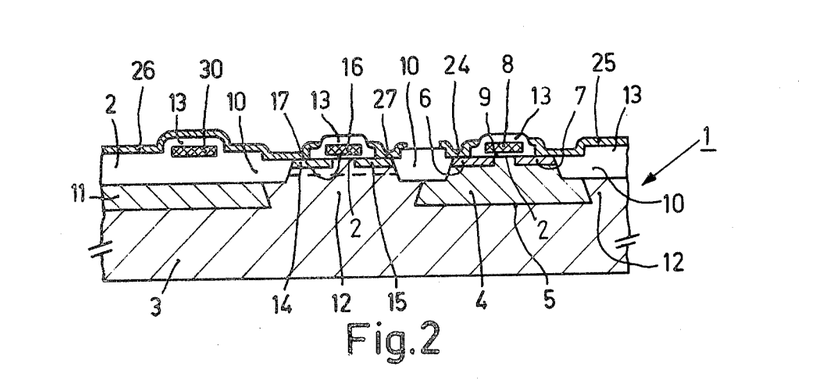
FIG. 2 is a diagrammatic cross-sectional view through the device shown in FIG. 1 taken on the line II—II.

FIG. 1 is a plan view and FIG. 2 a diagrammatic cross-sectional view taken on the line II—II of FIG. 1 of a part of a semiconductor device according to the invention. The device comprises a monocrystalline semiconductor body 1 of silicon which comprises a first region (3, 12) of p-type conductivity adjoining a surface 2 and a second region 4 of n-type conductivity likewise adjoining the surface 2 and forming with the first region (3, 12) a p-n junction 5.

P-type source and drain zones 6 and 7 adjoining the surface 2 are provided in the second region 4, between which source and drain zones a gate electrode layer 8, in this example of polycrystalline silicon, is provided which is separated from the semiconductor body by a layer 9, in this example of silicon oxide.

The device furthermore comprises a patter 10 of electrically insulating material which is a least partly inset or embedded in the silicon and in this example is silicon oxide, although other electrically insulating materials may also be considered. This pattern 10 bounds the second region 4 and the surface entirely, while the p-n junction 5 adjoins the inset pattern 10. The source and drain zones 6 and 7 also adjoin the inset oxide 10.

Furthermore the second region 4 comprises a part of an n-type epitaxial layer 11 which is provided on a p-type substrate region 3 associated with the first region (3, 12). The second region 4 is entirely surrounded by a locally provided or converted p-type zone 12 which is also associated with the first region and which extends from the surface 2 throughout the thickness of the epitaxial layer 11 and, at the surface 2, adjoins the inset pattern 10. The boundary of the zone 12 is denoted by the broken line (12) in FIG. 1.

The configuration described thus far is particularly suitable for use in combination with other semiconductor circuit elements and inter alia gives rise to integrated monolithic circuits having a very high packing density. In FIGS. 1 and 2, for example, according to the invention the coverted p-type zone 12 at the surface is entirely bounded by the inset pattern 10, while n-type source and drain zones 14 and 15 are provided in said zone 12 which is associated with the first region (3, 12), said source and drain zones adjoining the surface 2 and the inset pattern 10 and being associated with an n-p-n field effect transistor which is complementary to the p-n-p field effect transistor (6, 7, 8) and which has a gate electrode layer 16 of polycrystalline silicon which is provided between the source and drain zones 14 and 15 and is separated from the semi-conductor body by a layer 17 of silicon oxide.

Furthermore, a silicon oxide layer 13 is provided over the whole body, while the zones 6, 7, 14 and 15 and the gate electrode layers 8 and 16 are contacted, via windows 18 through 23 in the oxide layer 13, by aluminum layers 24 through 29.

Furthermore, in addition to the gate electrode layers 8 and 16, a polycrystalline silicon layer 30 is present on the oxide pattern 10 and serves as an interconnection between other parts of the circuit not shown. This interconnection 30 crosses the aluminum layer 26 and is covered by the oxide layer 13 at least at the area of the crossing.

A very compact assembly of complementary field effect transitors is obtained in this manner in which notably the contact surfaces between the source and drain zones and the contacting metal layers may have minimum dimensions, since the metal layers can extend partly on the adjoining oxide pattern 10. As will now be described in greater detail, said structure can be manufactured while using alignment steps with large tolerances and it enables inter alia the combination with various bipolar circuit elements to be manufactured simultaneously.

The described combination of complementary field effect transistors may advantageously be manufactured while using the following process steps, see FIGS. 3 through 12.

Figure 3:
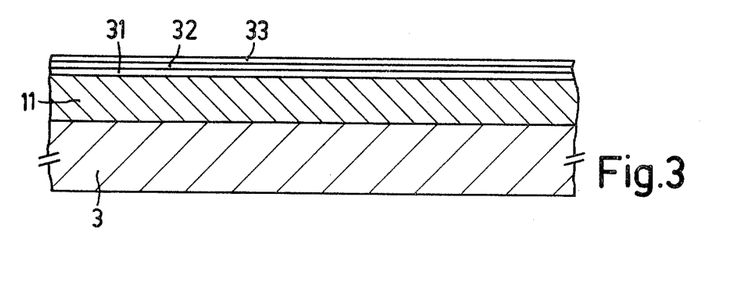
FIGS. 3 to 12 are diagrammatic cross-sectional views of the device shown in FIGS. 1 and 2 in successive stages of manufacture.

1. While using methods which are conventionally used in semiconductor technology, a 5 microns thick n-type silicon layer 11 having a resistivity of 6 ohm.cm is grown epitaxially on a p-type silicon substrate 3 having a resistivity of 1 ohm.cm. On the assembly, a 0.1 micron thick layer 31 of silicon oxide is provided by thermal oxidation. With the use of known methods, a 0.1 micron thick layer 32 of silicon nitride is then provided which is covered in turn with a 0.1 micron thick layer 33 of pyrolytically provided silicon oxide. The structure of FIG. 3 is then obtained. For the provision of silicon nitride layers and the methods used in etching thereof reference is made to Appels et al., "Philips Research Reports", April, 1970, pages 118–132, in which paper all the information is given which is necessary in this connection to those skilled in the art.

2. A mask masking against oxidation is then formed on a part of the surface by masking and etching from the layers 31 and 32. For that purpose, the oxide layer 33 is first given the shape of anti-oxidation mask by a usual photolithographic process in such manner that said mask covers at least one part of the surface entirely. The remaining parts of the oxide layer 33 are then used as a mask so as to give the underlying nitride layer 32 the desired shape by etching in phosphoric acid, after which the remaining parts of the layer 33 as well as the parts of the layer 31 not present below the nitride are removed by etching in a buffer solution with hydrofluoric acid.

Figure 4:
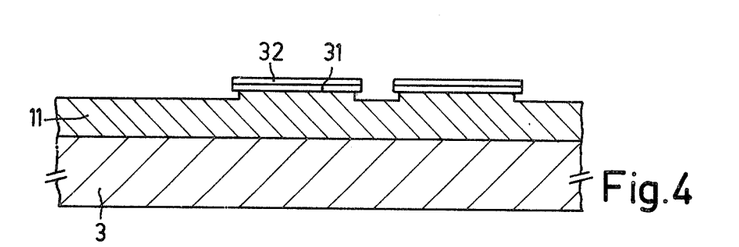

3. The parts of the silicon not covered by the layers 31 and 32 are then etched away over a depth of approximately 1 micron. The structure of FIG. 4 is then obtained. If desired, said etching steps may be omitted, in which case the inset oxide pattern to be formed will then partly project above the silicon surface.

4. The etched surface part of the silicon not covered by the mask (31, 32) are then oxidised by thermal oxidation at 1000° C for 16 hours in moist oxygen, an oxide pattern 10 which is inset in the body being formed the surface of which substantially coincides with the original surface of the semiconductor body.

Figure 5:
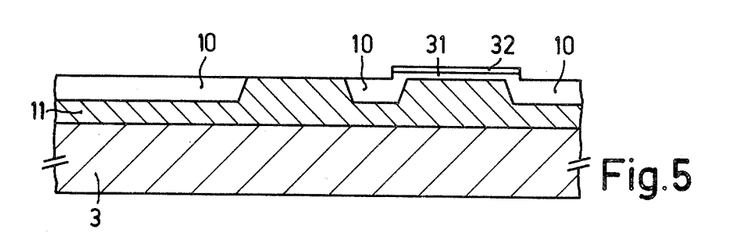

5. The layers 31 and 32 are now locally removed from parts of the epitaxial layer 11 by means of a masking and etching step with a large alignment tolerance, so that the structure of FIG. 5 is obtained.

Figures 6, 7:
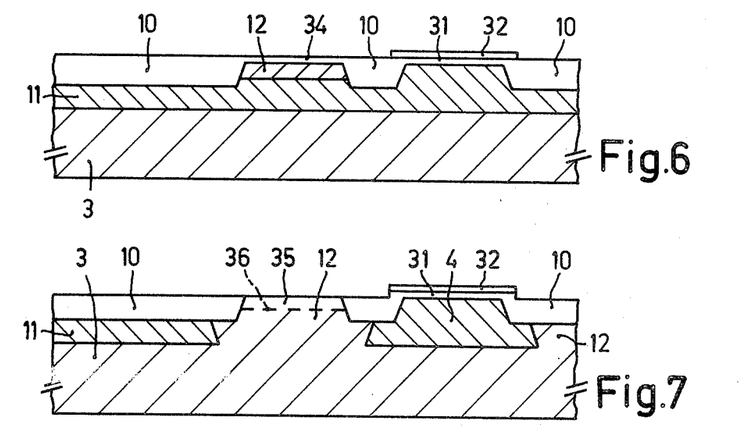
Figure 8:
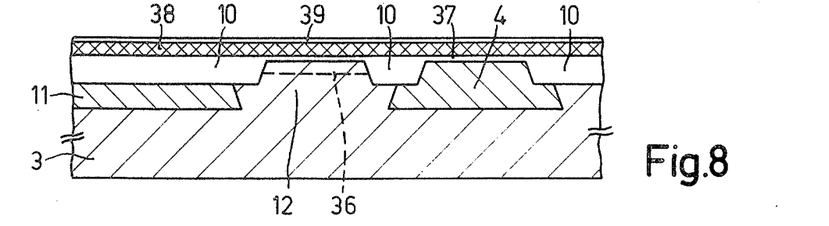
Figure 9:
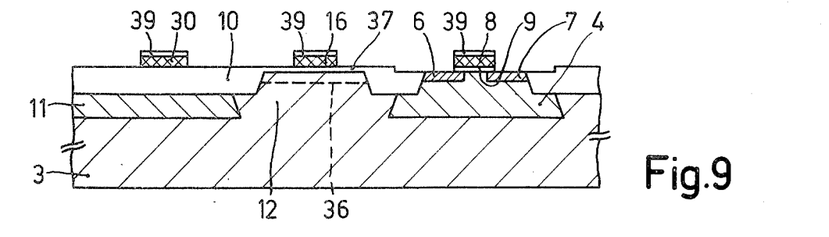
Figure 10:
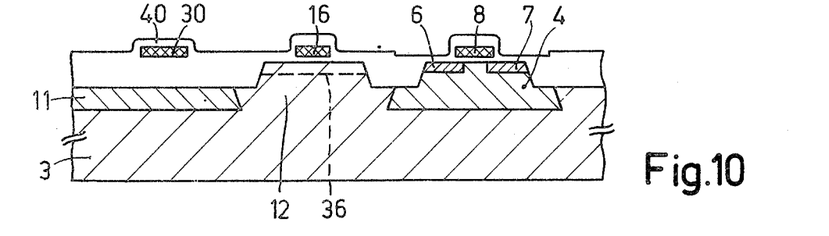
Figure 11:
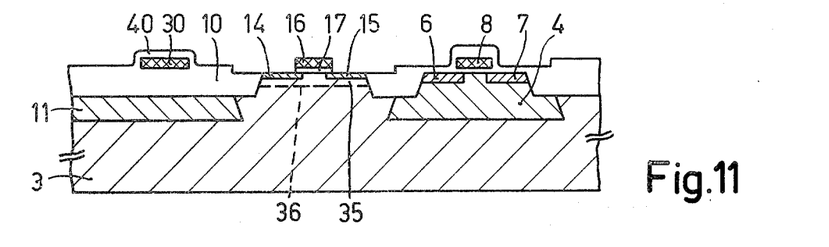
Figure 12:
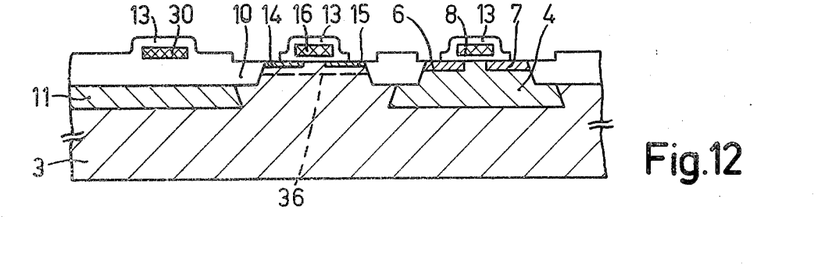

6. A boron diffusion is then carried out with boron nitride as a source, in which, with the use of known methods, the structure of FIG. 6 is obtained while using a deposition at approximately 920° C and an in-diffusion (drive-in). During this boron diffusion in which the inset oxide pattern 10 serves as a mask, an oxide layer 34 below which a converted p-type region 12 is present is formed on the silicon. In certain circumstances, this region 12 may also be formed by other technologies, for example, by ion implantation, the oxide pattern 10 also serving as a mask. When a directed ion beam is used which does not cover the surface part beyond the region 12, and the ions have sufficient energy to penetrate through the layers 31 and 32, said layers need be removed only prior to the out-diffusion to be described hereinafter.

7. The oxide layer 34 is then removed after which the boron partly penetrates further into the silicon down to the substrate region 3 at 1200° C for 4 hours in a capsule in a vacuum and for another part diffuses out via the surface. Said out-diffusion is preferably carried out in the presence of silicon powder which is either undoped or, in order to obtain a threshold value for the surface concentration at the surface of the region 12, has an accurately known comparatively low boron doping. This forms the previously-mentioned activator provided, locally converted, first type zones 12.

In this out-diffusion also, the oxide pattern 10 serves as a mask. A surface-adjoining layer 35 is formed in which the boron concentration increases from the surface inwardly, from a value of $10^{16}$ at/cm$^3$ at the surface to a maximum value of $3.10^{17}$ at/cm$^3$ at the area of the broken lines 36 at a depth of approximately 1.5 micron. The structure shown in FIG. 7 is obtained.

8. The layers 31 and 32 are then removed without the use of a mask. An oxide layer 27, 0.1 micron thick, is then provided by thermal oxidation, after which a 0.4 micron thick layer 38 of polycrystalline silicon is provided throughout the surface by thermal decomposition of $SiH_4$. Said layer 38 is strongly doped by a phosphorus diffusion and is then covered with a layer 39 of pyrolytic or thermal oxide, in a thickness of 0.1 micron, see FIG. 8.

9. Parts which comprise the gate electrode layers 8 and 16 of the field effect transistors to be provided, as well as the interconnection 30, are then formed from the layers 38 and 39 by using known photolithographic methods, see FIG. 9.

10. The oxide layer 37 of the surface part of the region 4 in which the p-channel field effect transistor is provided is then removed by etching. The layer 37 is maintained both below the gate electrode 8 and on the surface part denoted in FIG. 1 by 41. The mask used in said etching step is not critical.

11. The p-type source and drain zones 6 and 7 are then provided by means of a boron diffusion in which the gate electrode layer 8 and the oxide pattern 10 serve as a mask. Said doping may also be carried out differently, for example by ion implantation.

12. A 0.2 $\mu$ thick layer 40 of silicon oxide is then provided over the assembly (see FIG. 10), which layer is then etched away from a part of the surface of the zone 12 also with the use of a non-critical mask, see FIG. 11.

13. The source and drain zones 14 and 15 of the n-channel field effect transistor are then provided by means of a phosphorus diffusion. The gate electrode layer 16 and the oxide pattern 10 serve as a mask. this doping also, may be carried out differently, if desired, for example by ion implantation, in which the oxide layer 40 might be omitted when a directed beam is used. The zones 14 and 15 are provided entirely within the layer 35, see FIG. 11. The comparatively high boron concentration at the area of the line 36 prevents channel formation between the epitaxial layer and the zones 14 and 15 along the oxide 10.

14. A 0.6 micron thick oxide layer 13 is then provided over the assembly (see FIG. 12), if required after removing the layer 40, in which layer contact windows are provided by using a non-critical mask the edges of which may be present at least for a part above the oxide pattern 10. An aluminum layer is finally deposited which is brought in the desired shape in the usual manner by a photolithographic etching method, so that the structure shown in FIGS. 1 and 2 is obtained. The aluminum layer 24 inside the contact window contacts both the zone 6 and the region 41 (FIG. 1), as a result of which the region 4 is short-circuited with the zone 6. The channel region 12 of the field effect transistor (14, 15, 16) can be contacted on the lower side via the substrate region 3.

15. Finally an annealing treatment is carried out at 450° C for 30 minutes in a mixture of hydrogen and nitrogen.

The described manufacturing process can also be used substantially without the addition of extra process steps for the manufacture of combinations of one or more field effect transistors having one or more bipolar circuit elements, in particular bipolar transitors.

Figure 13:
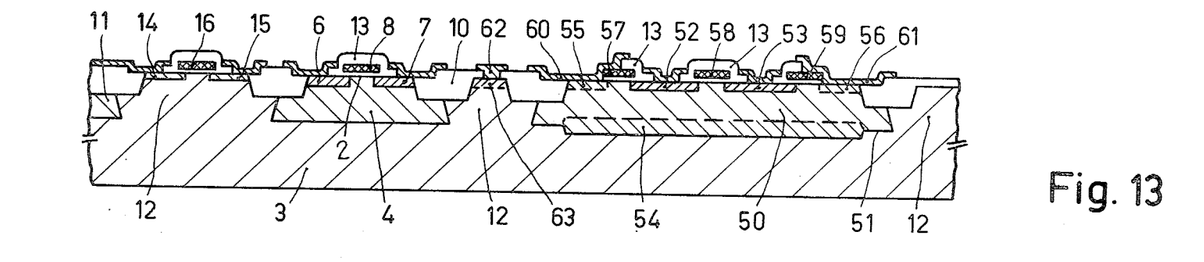
FIGS. 13, 14, 15, 16, 17 and 18 are successive diagrammatic cross-sectional views of several other embodiments of a device according to the invention.

FIG. 13, for example, shows a structure in which a bipolar lateral transistor is realised in addition to the above-described complementary field effect transistors (14, 15, 16) and (6, 7 8) so that the inset pattern 10 at the surface also bounds a further part 50 of the epitaxial layer 11, which part 50 is surrounded by a further locally provided, activator converted, p-type zone 12 which extends from the surface 2 down to the substrate region 3 and forms with the side walls of the further part a p-n junction 51 fully adjoining the inset pattern 10. Two p-type surface zones 52 and 53 are provided in the further part 50 of the eptiaxial layer, one of which forming the emitter zone and the other of which forming the collector zone of a bipolar lateral transistor, the further region 50 being the base zone. In order to prevent parasitic transistor effects between the substrate region 3 and the zones 52 and 53, an n-type buried layer 54 having a higher doping than the epitaxial layer is provided between the region 50 and the substrate region 3. Strongly n-type doped zones 55 and 56 are provided between the zones 52 and 53 and the inset pattern and may serve as contact diffusions and also for the further decrease of the said parasitic transistor action, but in certain circumstances they may be omitted. Furthermore, in order to prevent the formation of parasitic surface channels, field electrodes 57, 58 and 59 of polycrystalline silicon separated from the semiconductor surface by an oxide layer are provided and are connected to the region 50 by aluminum layers 60 and 61 which also form the base contact. The field electrode 58 is d.c. connected to the region 50 beyond the plane of the drawing.

In FIGS. 13, 14, 16 and 17, the region 3 is contacted, via a zone 12 on the upper side, to an aluminum layer 62, preferably, but not necessarily, by using a highly doped p-type zone 63, in which the contact window need be provided only in a rather thin oxide layer, since a nitride layer was present at the area of said contact window during the formation of the oxide pattern 10. In the examples of FIGS. 15 and 18, it is assumed that the region 3 is contacted on the lower side of the plate.

The structure of FIG. 13 can be realised in a very advantageous manner simultaneously with the formation of the complementary field effect transistors, in which all the zones 12 are formed during the above-mentioned process steps 6 and 7, the zones 52, 53 and 63 during the process step 11, the zones 55 and 56 during the process step 13 and the field electrodes 57, 58 and 59 during the process steps 8 and 9.

Figure 14:
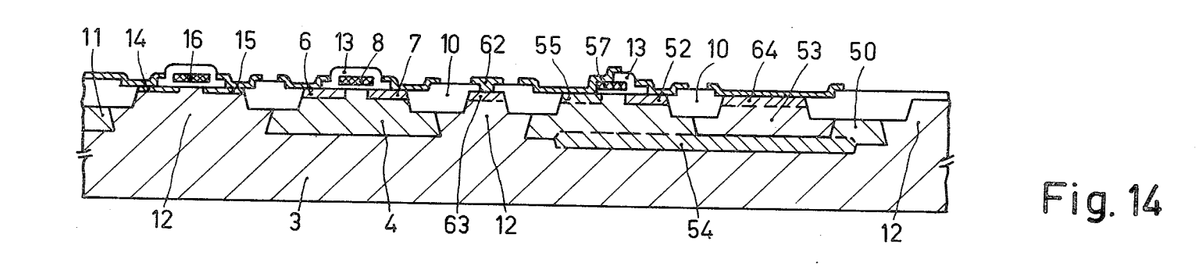
Figure 15:
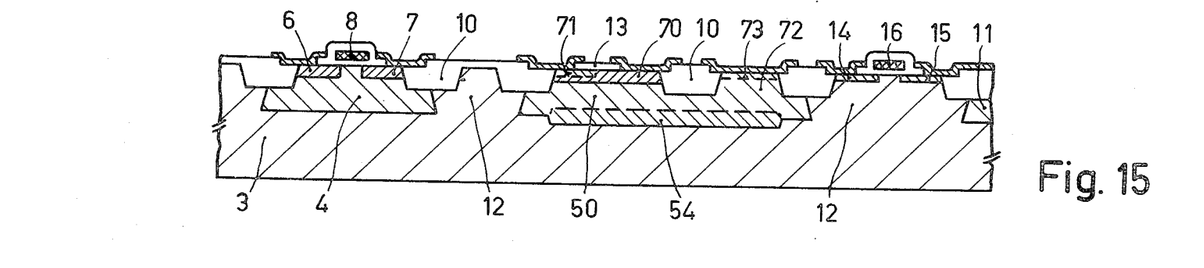

A variation of this structure forms the structure shown in FIG. 14 which differs from that of FIG. 13 inter alia in that the two zones 52 and 53 adjoin the oxide pattern 10 and in that the zone 53 extends down to the buried layer 54 and is provided simultaneously with the zones 12 in process steps 6 and 7, as a result of which the efficiency of the zone 53 is increased. If desired, a p-type contact zone 64 can be provided simultaneously with the zones 6, 7, 52 and 63. It will furthermore be obvious that, if desired, the zone 52 may also extend down to the layer 54 while omitting the field electrode 57.

FIG. 15 shows another important structure in which a p-type surface zone 70 bounded entirely by the inset pattern 10 is provided in the further part 50 of the epitaxial layer, within which zone 70 an n-type surface zone 71 adjoining the inset pattern 10 is provided. The further part 50 beside the zone 70 is furthermore connected to the surface via a part 72 thereof bounded by the inset pattern 10, preferably, but not necessarily, via a highly doped n-type contact zone 73. In this manner an insulated n-p-n vertical transistor is formed the zone 70 of which is the base, while one of the zones 71 and 50 forms the emitter zone and the other the collector zone. All zones are contacted by aluminum layers.

The zone 70 may advantageously be provided during the said process step 11, the zones 71 and 73 during the process step 13. Attention is drawn to the fact that the field effect transistor (14, 15, 16) unlike in the preceding examples, is not provided adjacent to the field effect transistor (6, 7, 8).

Figure 16:
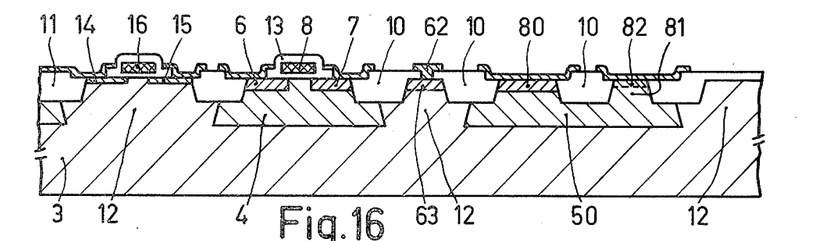

FIG. 16 shows a structure for providing one or more vertical transistors having a common collector (or emitter). A p-type surface zone 80 is provided in the further region 50 so that a vertical p-n-p transitor is formed having the region 50 as base zone while the zone 80 and the substrate region 3 one forms the emitter zone and the other forms the collector zone. In this case, the inset pattern 10 divides the region 50 at the surface into two island-shaped parts, in which the pattern 10 in the first part bounds the zone 80, while the region 50 adjoins the surface via the second island-shaped part 81 (via a highly doped contact zone 82).

During the manufacture of said structure, the zone 80 can advantageously be formed during the process step 11 together with the zones 6 and 7 and the zone 82 during the process step 13 together with the zones 14 and 15.

Figure 17:
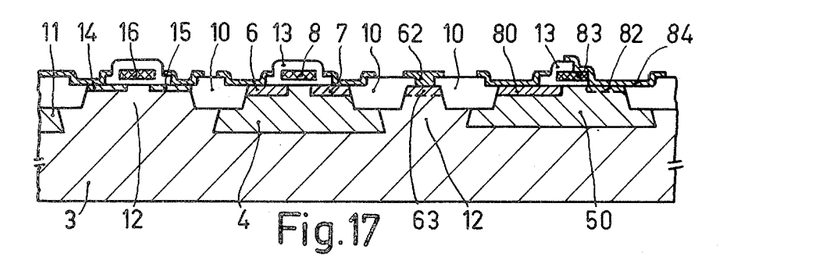
Figure 18:
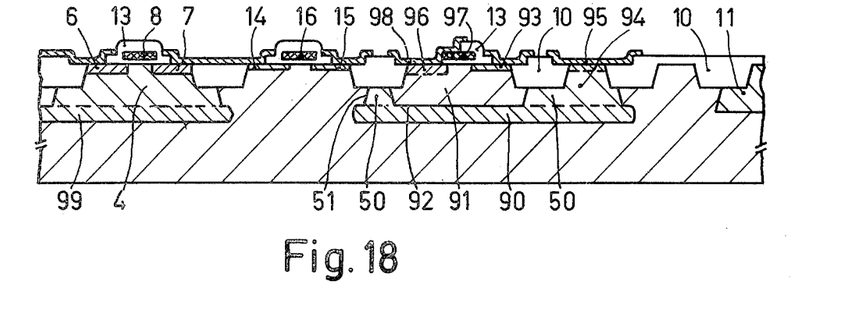

FIG. 17 shows a variation of the structure of FIG. 16 in which the inset pattern 10 does not enclose the zone 80 entirely and in which a more compact structure is obtained. However, in this case also it is desirable, in order to prevent the formation of a stray current channel, to provide a field electrode 83, for example of polycrystalline silicon, which is separated from the semiconductor surface by an oxide layer, which electrode is connected to the base zone 50 of the transistor by means of an aluminum layer 84. Said field electrode can advantageously be formed during the process steps 8 and 9.

FIG. 18 finally shows and example of an insulated vertical bipolar transistor in which an n-type buried layer 90 having a higher doping than the epitaxial layer 11 is provided between the further part 50 of the epitaxial layer 11 and the substrate region 3. Furthermore, a surface-adjoining p-type zone 91 bounded entirely by the inset pattern 10 is provided and adjoins the buried layer 90 and, with the adjoining n-type material, forms a second p-n junction 92 adjoining the inset pattern 10. An n-type surface zone 93 is provided in the zone 91. The zone 91 forms the base zone of the transistor, while of the zone 93 and the buried layer 90 one forms the emitter zone and the other forms the collector zone. In this example, the inset pattern 10 divides the further part 50 of the epitaxial layer at the surface into two island-shaped parts, of which the first part bounds the zone 91 provided in the layer, while the second part at the surface bounds an n-type zone 94 which connects the buried layer 90 to the surface (if desired, via a highly doped n-type contact zone 95). At the surface, the zone 91 comprises a highly doped contact zone 96. In order to prevent a stray surface current channel, a field electrode 97 of polycrystalline silicon is provided which is separated from the semiconductor surface by an oxide layer and is connected to the base zone of the transistor via the aluminum layer 98.

In this example, the region 4 adjoins an n-type buried layer 99 which may serve as an interconnection to other parts of the circuit.

The zone 91 may advantageously be provided during the process steps 6 and 7, the zone 96 during the process step 11, the zones 93 and 95 during the process step 13 and the field electrode 97 during the process steps 8 and 9.

It is to be noted that field electrodes, such as the electrodes 57, 58, 59 of FIGS. 13 and 14, 83 of FIG. 17, and 97 of FIG. 18, which serve to prevent stray current channels between, for example, emitter and collector, in themselves form a new and important improvement of a bipolar (lateral or vertical) planar transistor. Besides to the base, said field electrodes may, if desired, also be connected to another suitable potential of the circuit.

It will be obvious that the invention is not restricted to the embodiments described, but that many variations are possible to those skilled in the art without departing from the scope of this invention. For example, semiconductor materials other than silicon may be used for the various semiconductor zones. Conductive materials other than polycrystalline silicon may be used for the gate electrodes and field electrodes. The metal layers may consist of another conductive material instead of aluminum. The same applies to the insulating material which, instead of silicon oxide, may be another insulating material, for example, silicon nitride, aluminum oxide, and so on, or it may consist of composite layers of the said materials. Furthermore, all the said conductivity types may (simultaneously) be replaced by their opposite conductivity types.

many variations are possible also in the adopted method within the scope of the invention. For example, in particular the doping of the polycrystalline gate electrodes or field electrodes may be carried out simultaneously with the provision of one or more diffused (or implanted) zones, for example, source and drain zones, instead of already in the stage shown in FIG. 8. For example, some gate electrodes or field electrodes may be doped n-type and others may be doped p-type.

The provision of the mask masking against oxidation may be also carried out differently from the method described, while said mask may also have a different composition, provided the masking properties are satisfactory.

Although the field effect transistors described in the examples have only one insulated gate electrode, it will be obvious that the invention can be used as such to obtain a structure having field effect transistors with more than one insulated gate electrode, for example, tetrode field effect transistors.

Furthermore, it is to be noted that, although in the drawings the surface zones and source and drain zones, respectively, of the first conductivity type have a larger thickness than those of the second conductivity type, said zones may also have the same thickness, while, conversely, the surface zones of the second conductivity type may be thicker than those of the first conductivity type.

Finally, it is to be noted that, by the addition of extra zones in the structures described, other bipolar circuit elements, for example thyristors, can also be obtained, while for the activator dopings donors other than phosphorus and acceptors other than boron may be used.

What is claimed is:

1. A semiconductor device having a semiconductor body comprising plural semiconductor circuit elements including at least one insulated gate field effect transistor, said semiconductor body comprising a substrate portion of a first type conductivity and on the substrate portion an epitaxial layer of a second type conductivity opposite to that of the first and having a top surface, a pattern of electrically insulating material inset in the top surface of the epitaxial layer and surrounding and defining plural separated upstanding portions of the epitaxial layer, the top surfaces of said plural upstanding portions each extending to the top surface of the epitaxial layer within the insulating pattern, the epitaxial layer being thicker than the inset pattern and extending below the inset pattern, at least one of said upstanding portions and the underlying adjacent epitaxial layer portions containing a concentration of first type conductivity activators greater than that of unconverted epitaxial layer portions and sufficient to convert same to first type conductivity material to form at least one annular first zone of first type conductivity adjoining the top surface and which extends throughout the epitaxial layer thickness to connect to the substrate portion, another of said upstanding portions being of the second type conductivity to form a second region within the said annular first zone and adjoining the top surface, spaced source and drain zones of said field effect transistor and of the first type conductivity in the said second region and adjoining the top surface and also adjoining the inset pattern, at least one gate electrode layer of said field effect transistor and extending over the space between the source and drain zones and being separated from the semiconductor body by an insulating layer, said second region being island-shaped and also being entirely surrounded below the insulating pattern by a part of the activator-converted first type first zone of the epitaxial layer whereby said island shaped second region forms with the surrounding activator-converted zone and with the underlying substrate portion a p-n junction which also adjoins the inset pattern, and a further circuit element incorporated in said converted first zone of the epitaxial layer.

2. A semiconductor device as claimed in claim 1, wherein the further circuit element is a second field effect transistor complementary to the first, said second field effect transistor comprising surface adjoining spaced source and drain zones of the second type conductivity in said first zone and also adjoining the inset pattern, and at least one gate electrode layer separated from the semiconductor body by an insulating layer and overlying the space between said source and drain zones of the second transistor.

3. A semiconductor device as claimed in claim 1, wherein the inset pattern also bounds at the surface a further part of the epitaxial layer, which further part is surrounded by another annular activator-converted first zone of the epitaxial layer which activator-converted first zone extends from the surface down to the substrate portion and together with the latter forms with said further part a p-n junction entirely terminating at the inset pattern, at least a first surface zone of the first type conductivity being provided in the said further part of the epitaxial layer.

4. A semiconductor device as claimed in claim 3, wherein the said further part of the epitaxial layer forms the base zone of a bipolar lateral transistor of which the emitter and collector zones are formed by surface zones of the first type conductivity provided in said further part of the epitaxial layer.

5. A semiconductor device as claimed in claim 3, wherein said first surface zone of the first type conductivity provided in the said further part of the epitaxial layer is bounded entirely at the surface by the inset pattern, within which first surface zone a surface zone of the second type conductivity is provided which also adjoins the inset pattern, the said further part of the epitaxial layer also being connected to the surface via a part thereof bounded entirely at the surface by the inset pattern, the said first surface zone of the first type conductivity forming the base zone of a vertical bipolar transistor, the emitter and collector zones of which are formed by the surface zone of the second type conductivity and the further part of the epitaxial layer.

6. A semiconductor device as claimed in claim 3, wherein a buried layer of the second conductivity type having a higher doping concentration than the epitaxial layer is provided between the said further part of the epitaxial layer and the substrate portion.

7. A semiconductor device as claimed in claim 6, wherein said first surface zone of the first conductivity type is formed by a zone which extends down to the buried layer.

8. A semiconductor device as claimed in claim 3, wherein said first surface zone of the first type conductivity provided in the said further part of the epitaxial layer and the substrate portion form, respectively, the emitter and collector zones of a bipolar vertical transistor of which the said further part of the epitaxial layer forms the base zone.

9. A semiconductor device as claimed in claim 8, wherein the inset pattern divides the said further part of the epitaxial layer at the surface into first and second island-shaped parts, the pattern adjoining the first island-shaped part also bounding the said first surface zone of the first conductivity type, the said further part of the epitaxial layer adjoining the surface via the second island-shaped part.

10. A semiconductor device as claimed in claim 3, wherein a buried layer of the second type conductivity having a higher doping concentration than the epitaxial layer is provided between the said further part of the epitaxial layer and the substrate portion, and the said first surface zone of the first type conductivity is bounded entirely at the surface by the inset pattern, and is provided in the said further part so as to adjoin the buried layer, to be entirely surrounded by material of the second type conductivity, and to form therewith a second p-n junction adjoining the inset pattern, a surface zone of the second type conductivity being provided in said first surface zone, the said first surface zone of the first type conductivity forming the base zone of a bipolar vertical transistor, the emitter and collector zones of which are formed by the surface zone of the second type conductivity and the buried layer.

11. A semiconductor device as claimed in claim 10, wherein the inset pattern divides the said further part of the epitaxial layer at the surface into first and second island-shaped parts, the first island-shaped part bounding the said first zone of the first type conductivity, the second island-shaped part bounding at the surface a zone of the second type conductivity which connects the buried layer to the surface.

12. A semiconductor device as claimed in claim 4, wherein at least one field electrode is provided above the base zone of the bipolar transistor and is separated from the semiconductor surface by an insulating layer, extends over to at least one of the emitter and the collector zones, and is d.c. connected to the base zone to prevent the formation of a leakage current channel.

13. A semiconductor device as claimed in claim 1, wherein all the gate electrodes consist of highly doped polycrystalline silicon.

14. A semiconductor device as claimed in claim 1, wherein all first zones of the first conductivity type which extend down to the substrate portion have substantially the same thickness, all surface zones and source and drain zones of the first type conductivity have substantially the same thickness, and all surface zones and source and drain zones present of the second type conductivity have substantially the same thickness.

* * * * *

UNITED STATES PATENT AND TRADEMARK OFFICE
CERTIFICATE OF CORRECTION

PATENT NO. : 3,999,213
DATED : December 21, 1976
INVENTOR(S) : BERNARDUS MARIA MICHAEL BRANDT ET AL It is certified that error appears in the above-identified patent and that said Letters Patent are hereby corrected as shown below:

Column 3, line 6, change "transitor" to -- transistor --.

line 7, change "collctor" to -- collector --.

Column 7, line 25, change "patter" to -- pattern --.

Column 12, line 60, change "many" to -- Many --.

Signed and Sealed this

First Day of March 1977

[SEAL]

Attest:

RUTH C. MASON
Attesting Officer

C. MARSHALL DANN
Commissioner of Patents and Trademarks